US005397866A

United States Patent [19]

Lyons et al.

[11] Patent Number: 5,397,866

[45] Date of Patent: Mar. 14, 1995

[54] DUAL ACOUSTIC HORN ASSEMBLY

[75] Inventors: Harold W. Lyons, Killingworth; Jon H. Lyons, Deep River, both of Conn.

[73] Assignee: Whelen Technologies, Inc., Chester, Conn.

[21] Appl. No.: 41,829

[22] Filed: Apr. 1, 1993

[51] Int. Cl.[6] .............................................. H05K 5/00

[52] U.S. Cl. .................................. 181/152; 181/178; 181/179; 181/188; 181/189; 181/141; 381/86; 381/156

[58] Field of Search ............... 181/141, 143, 144, 145, 181/148, 152, 155, 156, 159, 179, 182, 188, 189, 190, 192, 194, 195, 178; 381/86, 90, 156, 158, 205

[56] References Cited

U.S. PATENT DOCUMENTS 1,853,955 4/1932 Blattner .............................. 181/188
4,334,211 6/1982 McConnell et al. ............ 181/143 X
4,878,561 11/1989 Tengstrand et al. ................ 181/188
5,008,944 4/1991 Sels et al. ........................ 181/141 X
5,187,333 2/1993 Adair .................................. 181/152

*Primary Examiner*—Khanh Dang
*Attorney, Agent, or Firm*—Chilton, Alix & Van Kirk

[57] ABSTRACT

An acoustic horn assembly for use as part of an electronic siren system for an emergency vehicle comprises a pair of integrated molded, rigid plastic members which cooperate to define a pair of divergent sound passages. The entrance ends of these sound passages are displaced do that they may be coupled to separate sound generators, the sound generators being supported from respective vehicle frame side rails. The sound generators are coupled to the sound passage entrance ends by adjustable length sound transmission conduits which are in the form of elbows.

19 Claims, 3 Drawing Sheets

DUAL ACOUSTIC HORN ASSEMBLY

BACKGROUND OF THE INVENTION

1. Field of the Invention.

The present invention relates to acoustic horn assemblies and particularly to horn assemblies for use with electronic siren systems and having a pair of sound generators. More specifically, this invention is directed to an acoustic horn having a pair of individual sound passages and a profile which permits installation beneath the front end of a vehicle with the mouths of the passages projecting through an air dam or skirt. Accordingly, the general objects of the present invention are to provide novel and improved apparatus of such character.

2. Description of the Prior Art

While not limited thereto in its utility, the present invention is particularly well suited for use as the sound producing portion of an electronic siren system for use on an ambulance. Present day automotive engineering, and particularly the adaptation of vans for use as ambulances, has placed a very high premium on available space at the front of such vehicles. A siren must, of course, discharge sound through the vehicle front, must generate an adequate level of sound, must not interfere with operation of the vehicle steering or cooling systems and must not reduce vehicle ground clearance. Additionally, a siren must be capable of secure and easy installation during the conversion of a factory assembled van into an emergency vehicle.

Previously available siren systems have failed to meet one or more of the above-mentioned criteria. Prior art sirens intended for use on "compact" vehicles have, for example, incorporated flexible sound pipes, as disclosed in U.S. Pat. No. 4,710,749, or have been designed for mounting on or in the vehicle front grill or on a vehicle front bumper, as exemplified by the combination siren and light disclosed in U.S. Pat. No. 4,884,523.

SUMMARY OF THE INVENTION

The present invention satisfies the above-briefly discussed criteria by providing a novel and improved acoustic horn assembly particularly well suited for use as part of an electronic siren system for an emergency vehicle. The electromechanical and mechanical components of a horn assembly in accordance with the present invention may be provided as an integral structure which is easily mounted beneath the engine compartment of a motor vehicle. This novel horn assembly is characterized by a pair of spacially displaced drivers which are located so as to be mounted from respective side rails of the vehicle frame. Each driver is protected by a plastic housing and secured to a rigid mounting bracket. The drivers are coupled to a molded rigid plastic horn defining member by means of adjustable elbows. A pair of discrete sound passages are formed by the horn defining member. Each of the sound passages is acoustically designed such that the air set in motion by the driver diaphragms, downstream of the elbows, travels along a path having a cross-sectional area which smoothly increases in two dimensions whereby an amplified sound will be projected from the adjacently located, but acoustically isolated, mouths of the passages. The couplings between the drivers and horn defining member, as well as the geometric shape of the sound passages, results in the generated sound being projected generally axially with respect to the vehicle and in the forward direction. The mouth portions of the sound passages are, as noted, juxtapositioned to one another and, in combination with the unitary structure of the horn defining member, permits the generated sound to be projected through a single opening in a front skirt or air dam of the vehicle. In a preferred embodiment, the drivers are supported from the vehicle frame so as to be facing in the downward direction and the sound waves produced thereby are turned 90° by the adjustable coupling members which extend between the drivers and respective throats of the horns, i.e., the small diameter ends of the sound passages. The sound waves are then caused to turn about a second angle of approximately 90° by the horns so as to be projected in a path which is offset from and generally transverse to the direction of air motion produced by the driver diaphragms.

Each horn of a dual acoustic horn assembly in accordance with the present invention is also characterized by a mouth portion which diverges. This divergence results from causing a wall portion which defines the discharge end of each horn to bend about an angle so as to turn outwardly, i.e., away from the common wall which isolates the two horn sections in the region of the mouths. The common wall, in the mouth region, has a shape which converges in the direction of the horn mouths.

BRIEF DESCRIPTION OF THE DRAWINGS

The present invention may be better understood and its numerous objects and advantages will become apparent to those skilled in the art by reference to the accompanying drawings wherein like reference numerals refer to like elements in the several figures and in which.

DESCRIPTION OF THE DISCLOSED EMBODIMENT

With reference now to the drawings, and particularly FIG. 1, a van which is to equipped for use as an emergency vehicle is indicated generally and schematically at 10. The vehicle 10 has a frame which includes a pair of side rails 12. An acoustic horn assembly in accordance with the invention is indicated generally at 14. In the manner to be described below, acoustic horn assembly 14 is supported from the frame side rails 12 and extends forwardly so as to project through the front skirt or air dam 16 of vehicle 10.

Figure 1B:
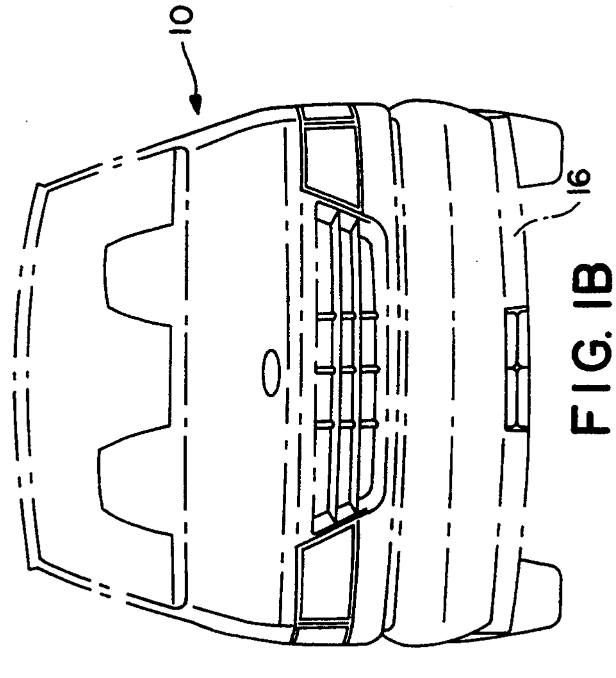
FIGS. 1A–1C depict a dual acoustic horn assembly in accordance with the invention in an installed state with the vehicle being shown in phantom.
Figure 1D:
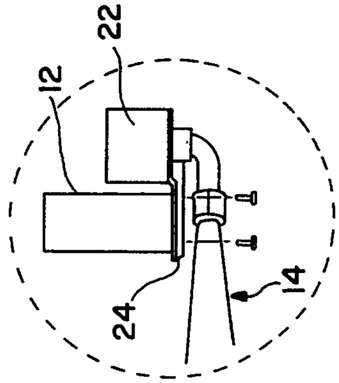
FIG. 1D is a partial enlarged view of the installation of FIGS. 1A–1C, FIG. 1D being a view taken in the same direction as FIG. 1A.
Figure 1A:
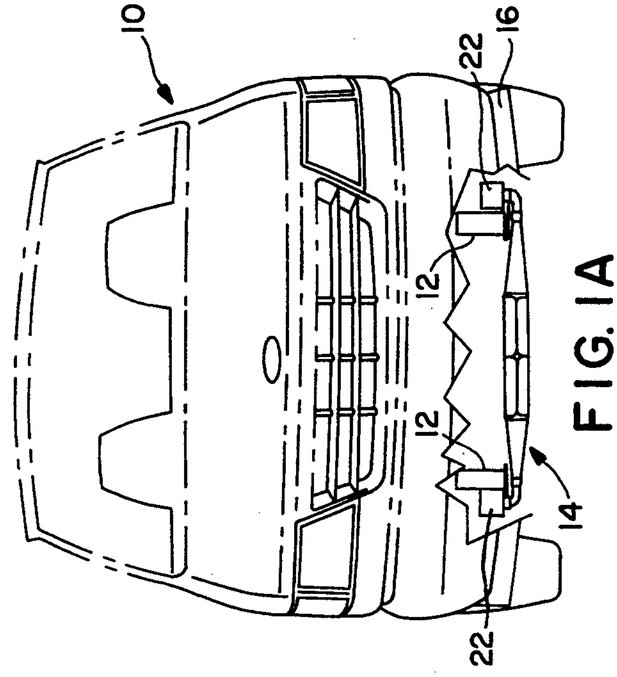
Figure 1C:
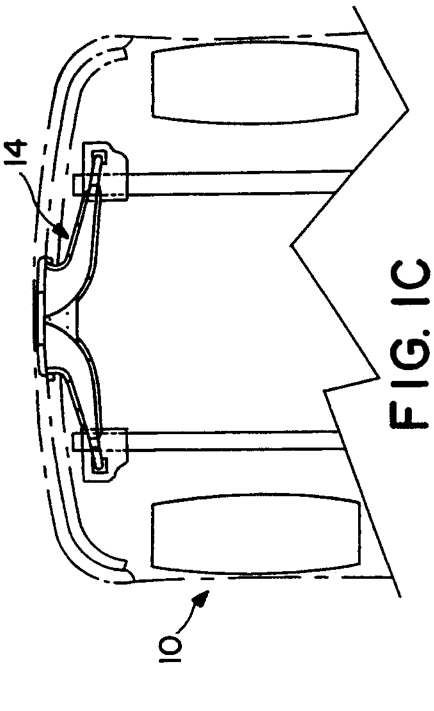
Figure 2:
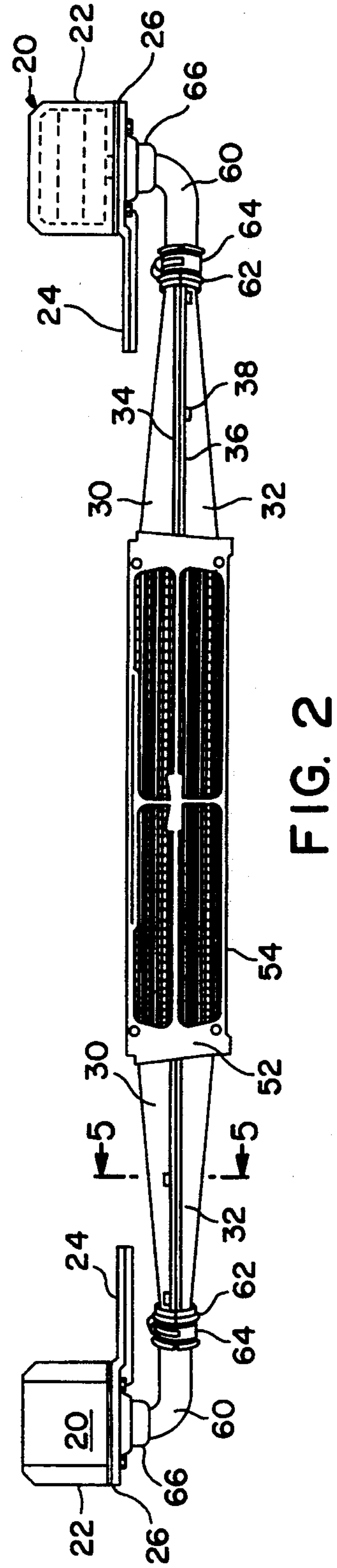
FIG. 2 is an enlarged front view of the dual acoustic horn shown in FIG. 1.

Acoustic horn assembly 14 comprises a pair of drivers, one of which is indicated in phantom at 20 in FIG. 2. The drivers 20 are loud speakers capable of high output power. Such drivers are well known in the art and may employ a phenolic diaphragm which is coupled to a voice coil whereby electronically generated signals commensurate with desired sound patterns will, when applied to the voice coil, cause movement of the diaphragm which, in turn, produces sound waves by setting air in motion. The drivers 20 are each provided with a protective plastic cover 22. Each driver is bolted to, and thus supported by, a mounting bracket 24. The mounting brackets 24 may, for example, be aluminum castings. Mounting brackets 24 are, in turn, bolted or clamped to respective of the vehicle frame side rails 12. A gasket 26 is provided between each cover 22 and its associated mounting bracket 24. The drivers are effectively environmentally shielded by their associated covers, brackets and gaskets. The covers 22 are removably connected to bracket 24 in any suitable manner.

In the disclosed embodiment, as may be seen from joint configuration of FIGS. 1 and 2, the drivers 20 are mounted such that the axis of the direction of movement of the diaphragms is, with the vehicle 10 on a horizontal surface, oriented substantially vertically with the driver discharge openings facing downwardly. This orientation enables the drivers 20 to be positioned at the level of the vehicle frame. Additionally, this arrangement results in the drivers being protected by the mounting brackets 24 from debris which might be projected upwardly from the road surface. The drivers, accordingly, do not interfere with other apparatus, do not reduce road clearance and are protected to the degree possible.

The acoustic horns which transmit the sound produced by the drivers 20 to the front of the vehicle are formed from a pair of molded plastic parts, i.e., a top half 30 and a bottom half 32. These two molded plastic parts are respectively provided with flanges 34 and 36 and, in accordance with a preferred embodiment, mate in a tongue and groove arrangement. The horn defining member top half 30 and bottom half 32 are bolted together to provide a unitary assembly which, in the manner to be described below, is coupled to and integrated with the drivers 20. The top and bottom horn defining members 30 and 32 cooperate to define acoustically engineered, smooth walled, diverging sound passages which extend from their narrow entrance ends or throats to respective discharge ends or mouths. The horn defining members are assembled employing bolts 38.

The shape of the sound passages or horns may best be seen from joint consideration of FIGS. 2–6. The passages diverge in two dimensions, i.e., in width and height, from the entrance end of the sound passages. The sound passages, from the throats to the mouths, also evolve from a circular cross-section to a complex shape which approaches a rectangle. As best seen from FIG. 3, an outer wall portion 40 of each sound passage, i.e., the wall disposed furthest from the vehicle center line, turns back on itself at the horn mouth so that the sound is discharged via an opening which is divergent in the desired direction of radiation. The wall portions 40 are, of course, defined by both of members 30 and 32. The sound passage defining wall portions disposed oppositely with respect to wall portions 40, as indicated at 42, merge at the horn mouths. Thus, wall portions 42 form a common dividing wall structure wall. This common dividing wall extends forwardly, i.e., in the downstream direction of sound travel, approximately to the plane defined by the most forwardly disposed ends of the front wall portions 40 and cooperates with front wall portions 40 to form a pair of adjacent, but acoustically isolated, divergent sound discharge openings.

Figure 5:
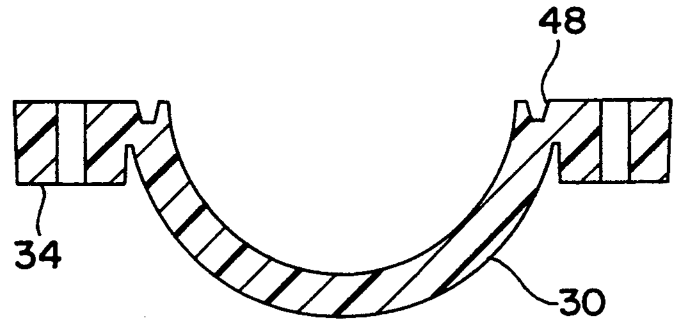
FIG. 5 is a cross-sectional view, taken along line 5—5 of FIG. 2, which shows a portion of the top half of the acoustic horn of the invention.
Figure 6:
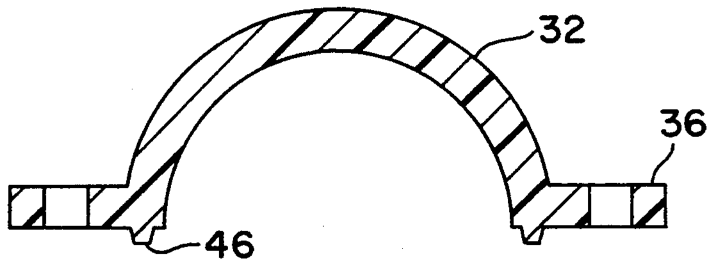
FIG. 6 is a cross-sectional view, also taken along line 5—5 of FIG. 2, which shows a portion of the bottom half of the acoustic horn of the invention.

In order to enhance the structural integrity of the molded plastic horn component of a siren in accordance with the invention, as may be seen from FIGS. 5 and 6, the horn defining molded plastic members 32 and 30 of the disclosed embodiment are provided with interlocking tongues 46 and grooves 48. In a preferred embodiment, the tongues and grooves are formed so as to be in registration with the walls which define the acoustic passages, i.e., the mechanical interlock is located inwardly with respect to the flanges 34, 36. The tongue receiving grooves 48 may be seen in FIG. 5 and tongues 46 may be seen from FIG. 6.

Figure 3:
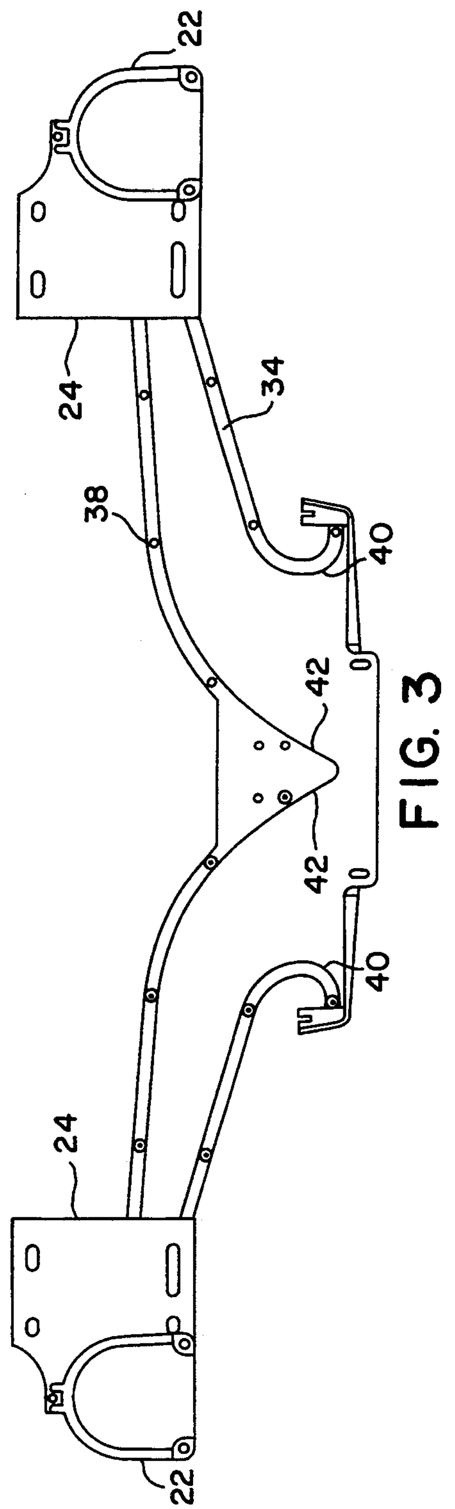
FIG. 3 is a top view of the apparatus of FIG. 2.
Figure 4:
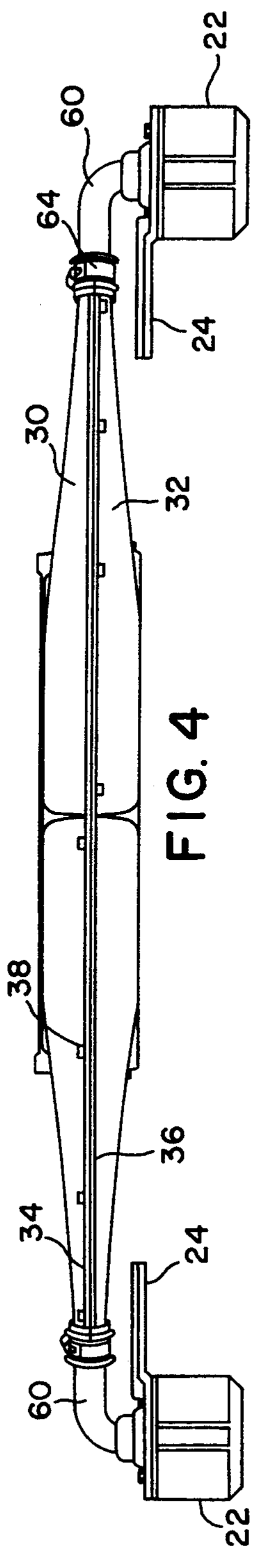
FIG. 4 is a rear view of the apparatus of FIGS. 2 and 3.

As may be seen from joint consideration of FIGS. 2 and 3, the horn defining members 30 and 32, at the mouths or discharge ends of the sound passages, cooperate to form a single generally rectangular opening. The unitary horn assembly may be affixed to the vehicle air dam 16 in any suitable manner so as to be in registration with a single opening cut into the plastic air dam. A cover plate 52, which supports a protective screen 54 in place over the mouths of the sound passages, will be installed over the mouths of the horn assembly. The horn assembly will be affixed to the air dam 16 in any suitable manner.

The drivers 20 each have throat portion downstream of the movable diaphragms. These throat portions are coupled to the small diameter entrance ends, i.e., the throats, of the horn by means of elbows 60. First ends of the elbows 60 are inserted into sockets 62 formed in the horn defining member so as to abutt the throats of the horns. The elbows 60 are clamped to the horn defining member by means of hose clamps 64, clamping being permitted by providing slots in sockets 62. The inner diameter of the elbows 60 is constant and the same as the diameter of the throats of the acoustic horns and the throats of the drivers. The opposite ends of the elbows 60 are tightly received in couplings 66 provided on the drivers 20, the couplings 66 each extending through a hole provided therefore in the associated bracket 24. The elbows will be inserted in the couplings so that there is a smooth transition between each driver and interior of its associated elbow, i.e., the walls of the sound path between the discharge ports of the drivers and interior of the acoustic horns will be free of significant irregularities. The elbows 60 constitute adjustable sound path defining members which enable the horn assembly of the present invention to be installed on a wide variety of vehicle makes and models. Thus one of both ends of the elbows 60 may be trimmed to the appropriate length determined by the particular installation. In a preferred embodiment, the elbose are cast aluminum members which may be sawed to the proper length.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. A speaker system comprising:

first driver means, said first driver means generating sound waves in response to an applied electrical signal;

means supporting said first driver means so that said sound waves generated thereby will be propagated in a first direction;

second driver means, said second driver means generating sound waves in response to an applied electrical signal;

means supporting said second driver means so that said sound waves generated thereby will be propagated in a direction which is substantially parallel to said first direction;

means defining a pair of acoustic horns, said horns each having an entrance end and a discharge end, said horn entrance ends having a circular cross-sectional area and being spatially displaced, said horn discharge ends being adjacently located and having a divergent shape, said horn discharge ends each having a cross-sectional area defining a width and a height wherein the width is larger than the height, said horn discharge ends being acoustically isolated and being in part defined by a common wall which converges at said horn discharge ends, the sound waves exiting said horn discharge ends being propagated in a second direction which is different from and angularly related to said first direction, said horns each turning sound waves coupled thereto at said entrance ends through an angle in relation to said first direction in excess of 45°; and means for coupling each of said driver means to a said horn entrance end.

2. The speaker system of claim 1 wherein said first direction is oriented substantially vertically and said second direction is oriented substantially horizontally.

3. The speaker system of claim 1 wherein said coupling means turn the sound waves received from a respective of said driver means through an angle of approximately 90° in relation to said first direction before delivering the sound waves to said entrance end of the associated horn.

4. The speaker system of claim 1 wherein each of said coupling means has a length and the lengths of said coupling means may be adjusted.

5. The speaker system of claim 1 wherein said coupling means each have a smooth inner diameter of constant cross-sectional area and where the cross-sectional area of each of said horns increases smoothly from said entrance end to said discharge end.

6. The speaker system of claim 5 wherein said horns each smoothly diverge in both width and height from said entrance ends to said discharge ends.

7. The speaker system of claim 1 further comprising:

cover means for each of said driver means, said cover means each cooperating with an associated supporting means for environmentally shielding the associated driver means from the ambient atmosphere.

8. The speaker system of claim 1 wherein said supporting means are adapted to be connected to a pair of opposingly spaced vehicle frame side rail and wherein said coupling means each have a pair of opposite ends, the dimensions of said coupling means being selectively adjustable by removing a portion of said ends whereby said speaker system may be installed on a-vehicle regardless of the spacing between the vehicle frame side rails.

9. The speaker system of claim 8 wherein said first direction is oriented substantially vertically and said second direction is oriented substantially horizontally.

10. The speaker system of claim 9 wherein said coupling means turn the sound waves received from a respective of said driver means through an angle of approximately 90° in relation to said first direction before delivering the sound waves to said entrance end of the associated horn.

11. A speaker system comprising:

first driver means, said first driver means generating sound waves in response to an applied electrical signal;

means supporting said first driver means so that said sound waves generated thereby will be propagated in a first direction;

second driver means, said second driver means generating sound waves in response to an applied electrical signal;

means supporting said second driver means so that said sound waves generated thereby will be propagated in a direction which is substantially parallel to said first direction;

means defining a pair of acoustic horns having entrance and discharge ends, said horn defining means comprising a pair of molded plastic members, said plastic members being rigid, said horn entrance ends being spatially displaced and each defining an axis, said horn discharge ends having a divergent shape and being adjacently located, said horn discharge ends being acoustically isolated and being in part defined by a common wall which converges at said horn discharge ends, the sound waves exiting said horn discharge ends being propagated in a second direction which is different from and angularly related to said first direction, said horns each turning sound waves coupled thereto at said entrance ends through an angle in excess of 45° relative to said first direction; and means for coupling each of said driver means to a horn entrance end.

12. The speaker system of claim 11 wherein said plastic members are provided with mating tongues and grooves.

13. The speaker system of claim 11 wherein said first direction is oriented substantially vertically and said second direction is oriented substantially horizontally.

14. The speaker system of claim 13 wherein said supporting means are adapted to be connected to a pair of opposingly spaced vehicle frame side rails and wherein said coupling means each have a pair of opposite ends, the dimensions of said coupling means being selectively adjustable by removing a portion of said ends whereby said speaker system may be installed on a vehicle regardless of the spacing between the vehicle frame side rails.

15. The speaker system of claim 14 wherein said coupling means each have a smooth inner diameter of constant cross-sectional area and wherein the cross-sectional area of each of said horns increases smoothly from said entrance end to said discharge end.

16. The speaker system of claim 15 wherein said horns each have a generally circular cross-sectional area at their entrance ends and cross-sectional shape having an average dimension in said second direction which is larger than an average dimension in said first direction at their discharge ends.

17. The speaker system of claim 16 wherein said coupling means turn the sound waves received from a respective of said driver means through an angle of approximately 90° in relation to said first direction before delivering the sound waves to said entrance end of the associated horn.

18. The speaker system of claim 17 wherein said horn defining plastic members are provided with mating tongues and grooves.

19. The speaker system of claim 18 further comprising:

cover means for each of said driver means, said cover means each cooperating with an associated supporting means for environmentally shielding the associated driver means from the ambient atmosphere.

* * * * *